United States Patent
Yamada et al.

(10) Patent No.: US 9,276,023 B2
(45) Date of Patent: Mar. 1, 2016

(54) IMAGE PICKUP ELEMENT HOUSING PACKAGE, AND IMAGE PICKUP DEVICE

(71) Applicant: KYOCERA Corporation, Kyoto-shi, Kyoto (JP)

(72) Inventors: Hiroshi Yamada, Satsumasendai (JP); Akihiko Funahashi, Kagoshima (JP); Yousuke Moriyama, Satsumasendai (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 30 days.

(21) Appl. No.: 14/361,444

(22) PCT Filed: Nov. 30, 2012

(86) PCT No.: PCT/JP2012/081216
§ 371 (c)(1),
(2) Date: May 29, 2014

(87) PCT Pub. No.: WO2013/081156
PCT Pub. Date: Jun. 6, 2013

(65) Prior Publication Data
US 2014/0346627 A1  Nov. 27, 2014

(30) Foreign Application Priority Data

Nov. 30, 2011  (JP) ................ 2011-262245

(51) Int. Cl.
*H01L 27/14* (2006.01)
*H01L 27/146* (2006.01)
(Continued)

(52) U.S. Cl.
CPC .......... *H01L 27/14601* (2013.01); *H01L 23/08* (2013.01); *H01L 27/14618* (2013.01);
(Continued)

(58) Field of Classification Search
CPC ............ H01L 27/14601; H01L 31/0232; H01L 23/08; H01L 27/14618; H01L 31/0203; H01L 2224/4824; H01L 2224/48091; H01L 2224/49175; H04N 5/2253; H04N 5/2257
See application file for complete search history.

(56) References Cited

U.S. PATENT DOCUMENTS

2004/0069998 A1*  4/2004  Harazono ......... H01L 27/14618
                                                        257/81
2006/0187327 A1    8/2006  Mabuchi et al.
(Continued)

FOREIGN PATENT DOCUMENTS

JP  07-087408 A   3/1995
JP  07-273301 A  10/1995
(Continued)

OTHER PUBLICATIONS

International Search Report, PCT/JP2012/081216, Feb. 25, 2013, 4 pgs.
(Continued)

*Primary Examiner* — Victor A Mandala
(74) *Attorney, Agent, or Firm* — Volpe and Koenig, P.C.

(57) ABSTRACT

An imaging device accommodating package includes an insulating base body and an imaging device connecting pad. The insulating base body includes a lower surface, a through-hole and a bonding area on the bottom surface of the recess. The lower surface includes a recess. The through-hole is formed in a bottom surface of the recess in a perspective plan view. The bonding area is used for an imaging device. The imaging device connecting pad is formed on an upper surface of the insulating base body or on an inner surface of the through-hole.

18 Claims, 15 Drawing Sheets

(51) Int. Cl.
*H01L 31/0203* (2014.01)
*H01L 23/08* (2006.01)
*H04N 5/225* (2006.01)
*H01L 31/0232* (2014.01)

(52) U.S. Cl.
CPC ........ *H01L31/0203* (2013.01); *H01L 31/0232* (2013.01); *H04N 5/2253* (2013.01); *H04N 5/2257* (2013.01); *H01L 2224/4824* (2013.01); *H01L 2224/48091* (2013.01); *H01L 2224/49175* (2013.01)

(56) References Cited

U.S. PATENT DOCUMENTS

| | | | |
|---|---|---|---|
| 2006/0220232 A1* | 10/2006 | Tanida | H01L 27/14618 257/723 |
| 2009/0051774 A1* | 2/2009 | Shiraishi | H04N 5/2251 348/207.99 |
| 2009/0230487 A1 | 9/2009 | Saitoh et al. | |
| 2010/0200898 A1* | 8/2010 | Lin | H01L 27/14618 257/294 |
| 2011/0084118 A1* | 4/2011 | Wada | B23K 1/0016 228/175 |

FOREIGN PATENT DOCUMENTS

| JP | 2002-100691 A | | 4/2002 |
|---|---|---|---|
| JP | 2003-243636 | * | 8/2003 |
| JP | 2003-243636 A | | 8/2003 |
| JP | 2004-063782 A | | 2/2004 |
| JP | 2006-201427 | * | 8/2006 |
| JP | 2006-201427 A | | 8/2006 |
| JP | 2006-261638 A | | 9/2006 |
| JP | 2006-278726 A | | 10/2006 |
| JP | 2007-019154 A | | 1/2007 |
| JP | 2007-329813 A | | 12/2007 |
| JP | 2008-244437 A | | 10/2008 |
| JP | 2008-300695 A | | 12/2008 |
| JP | 2011-086670 A | | 4/2011 |

OTHER PUBLICATIONS

Japanese Office Action, Japanese Patent Application No. 2013-547260, Mar. 3, 2015, 12 pgs.

* cited by examiner (a)

(b)

(a)

(b)

(c)

(a)

(b)

(c)

(a)

(b)

(c)

(d)

(a)

(b)

(a)

(b)

(a)

(b)

(a)

(b)

(a)

(b)

ically important, such as a mobile telephone or a digital camera, is required to have a lower profile. In contrast, with a conventional imaging apparatus as described above, an imaging device is flip-chip mounted on an insulating base body and ball-like bumps are present between the insulating base body and the imaging device, preventing the imaging apparatus to have a low profile.

IMAGE PICKUP ELEMENT HOUSING PACKAGE, AND IMAGE PICKUP DEVICE

TECHNICAL FIELD

The present invention relates to an imaging device accommodating package in which an image device, such as a charge-coupled device (CCD) or a complementary metal-oxide-semiconductor (CMOS) imaging device, is accommodated and to an imaging apparatus.

BACKGROUND ART

An imaging apparatus applied to a digital camera in which an imaging device, such as a CCD or a CMOS imaging device, is mounted on a base body, an optical sensor, or the like is known in the prior art. As this type of imaging apparatus, an imaging apparatus is known that has a base body in which a through-hole is formed at the center and a recess is formed in the lower surface so that the through-hole is positioned inside and also has an imaging device that is flip-chip mounted on the bottom surface of the recess in the base body (see PTL 1, for example). The base body has connection electrodes around the through-hole in the lower surface and external terminals on the outer circumference. This type of imaging apparatus converts, for example, light (image) input to a light-receiving part of the imaging device through the through-hole to an electric signal by the imaging device and transfers the electric signal to the connection electrode of the base body.

CITATION LIST

Patent Literature

PTL 1: Japanese Unexamined Patent Application Publication No. 2006-201427

SUMMARY OF INVENTION

Technical Problem

However, an imaging apparatus used in, for example, an electronic device for which portability is important, such as a mobile telephone or a digital camera, is required to have a lower profile. In contrast, with a conventional imaging apparatus as described above, an imaging device is flip-chip mounted on an insulating base body and ball-like bumps are present between the insulating base body and the imaging device, preventing the imaging apparatus to have a low profile.

Solution to Problem

An imaging device accommodating package in an aspect of the present invention includes an insulating base body and an imaging device connecting pad. The insulating base body includes a lower surface, a through-hole and a bonding area on the bottom surface of the recess. The lower surface includes a recess. The through-hole is formed in a bottom surface of the recess in a perspective plan view. The bonding area is used for an imaging device. The imaging device connecting pad is formed on an upper surface of the insulating base body or on an inner surface of the through-hole.

An imaging apparatus in another aspect of the present invention has an imaging device accommodating package with the structure described above and an imaging device accommodated in the recess of the imaging device accommodating package.

Advantageous Effects of Invention

An imaging device accommodating package according to an aspect of the present invention enables, for example, the imaging device accommodating package and an imaging device to be bonded by using a bonding material and also enables the imaging device accommodating package and imaging device to be electrically connected by using imaging device connecting pads formed on the upper surface of an insulating base body or on the inner surfaces of a through-hole with bonding wires. Therefore, the height of the side walls of the recess in the insulating base body can be lowered by using a bonding material instead of bumps and connection electrodes, which have been present between the insulating base body and the imaging device, enabling the profile of the imaging device accommodating package to be lowered.

An imaging apparatus according to another aspect of the present invention has an imaging device accommodating package with the structure described above, so the imaging apparatus can have a low a profile and improved connection reliability.

DESCRIPTION OF EMBODIMENTS

Some exemplary embodiments of the present invention will be described with reference to the drawings.

First Embodiment

Figure 1:
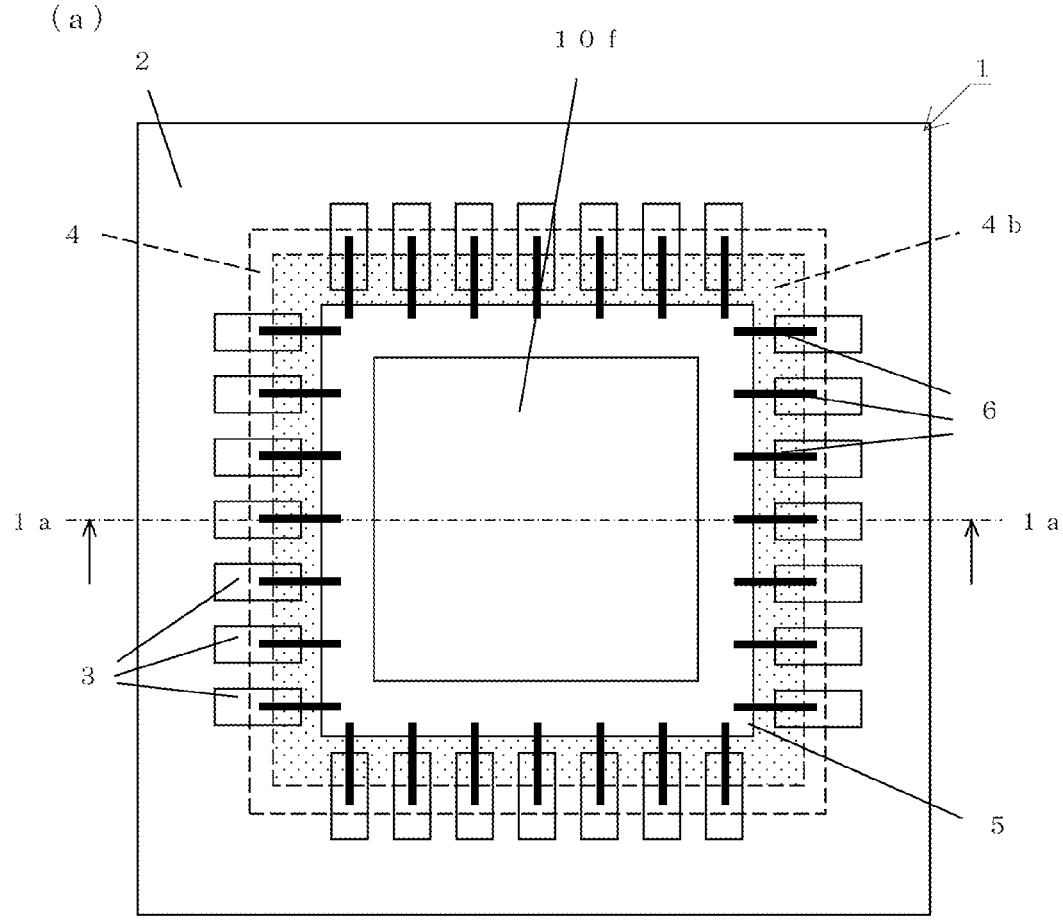
FIG. 1(a) is a perspective plan view illustrating an example of an imaging apparatus in a first embodiment of the present invention.
FIG. 1(b) is a cross-sectional view as taken along line 1a-1a in FIG. 1(a).
Figure 1:
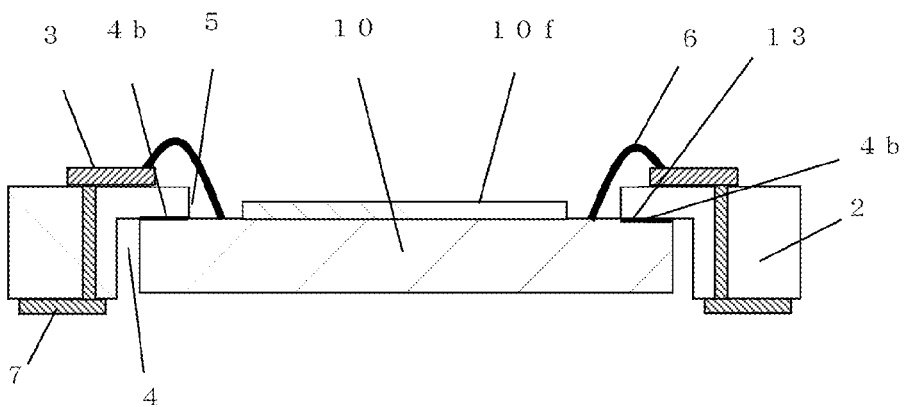

An imaging apparatus in a first embodiment of the present invention will be described with reference to FIGS. 1 to 3. The imaging apparatus in this embodiment has an imaging device accommodating package 1 and an imaging device 10 accommodated in the imaging device accommodating package 1.

The imaging device accommodating package 1 has an insulating base body 2 and imaging device connecting pads 3 formed on the upper surface of the insulating base body 2.

The insulating base body 2 has a lower surface including a recess 4 and has a through-hole 5 in the bottom surface of the recess 4 in a perspective plan view. The through-hole 5 is formed so that it passes through the bottom surface of the recess 4 in the insulating base body 2 and the upper surface of the insulating base body 2.

The insulating base body 2 has a bonding area 4b where the imaging device 10 is bonded to the bottom surface of the recess 4 by using a bonding material 13 such as a resin. The insulating base body 2 is formed by, for example, vertically laminating a plurality of substantially quadrangular insulating layers made of electrically insulating ceramics, such as an aluminum oxide sintered body, a mullite sintered body, a silicon carbide sintered body, an aluminum nitride sintered body, a silicon nitride sintered body or a glass ceramic sintered body, of a resin such as one of fluorine-based resins including epoxy resin, polyimide resin, acrylic resin, phenol resin, polyester resin, and polytetrafluoroethylene resin, or of plastics.

If the insulating base body 2 is made of, for example, an aluminum oxide sintered body, the insulating base body 2 is manufactured by adding a sintering aid, such as silicon oxide, magnesium oxide or calcium oxide, to powdered aluminum oxide, further adding an appropriate organic binder, an appropriate solvent, and the like, mixing them to form a slurry, applying a doctor blade method or calendar roll method to the slurry to form a ceramic green sheet (raw sheet), performing appropriate punching on this ceramic green sheet to machine it to a substantially quadrangular form, laminating a plurality of resulting ceramic green sheets, and sintering them.

If the insulating base body 2 is made of, for example, a resin, the insulating base body 2 can be formed in a transfer molding method, an injection molding method, or the like by being molded with a mold that can form a predetermined shape. Alternatively, a base material made of glass fiber is impregnated with a resin like, for example, glass epoxy resin. In this case, the insulating base body 2 can be formed by impregnating the base material made of glass fiber with the precursor of epoxy resin and thermally curing the epoxy resin precursor at a predetermined temperature.

On the insulating base body 2, imaging device connecting pads 3 are formed on the upper surface of the insulating base body 2 in an adhering manner, and wiring conductors 7 including a through conductor, such as a via-hole or a through-hole, are formed so as to extend from the upper surface of the insulating base body 2 through the interior of the insulating base body 2 to its lower surface. Thus, the imaging device connecting pads 3 are electrically connected through the wiring conductors 7 to an external circuit board (not shown). If the insulating base body 2 is made of ceramics, the imaging device connecting pad 3 and wiring conductor 7 are made by metalizing metal powder such as tungsten (W), molybdenum (Mo), manganese (Mn), silver (Ag), or copper (Cu). The imaging device connecting pad 3 and wiring conductor 7 are formed at predetermined positions on the insulating base body 2 by printing conductive pastes intended for the imaging device connecting pad 3 and wiring conductor 7 on the ceramic green sheet intended for the insulating base body 2 by a screen printing method or the like and firing the pastes together with the ceramic green sheet. As for the through-conductor, which passes through the ceramic green sheet in its thickness direction, the through-conductor being an internal conductor, the through-hole, which has been formed in the ceramic green sheet by printing a conductive paste, may be filled. This type of conductive paste is prepared by adding an appropriate solvent and binder to metal powder such as tungsten (W), molybdenum (Mo), manganese (Mn), silver (Ag), copper (Cu) or the like and mixing them to adjust the mixture to an appropriate viscosity. To increase the intensity of the bonding to the insulating base body 2, the conductive paste may include glass or ceramics.

If the insulating base body 2 is made of a resin, the imaging device connecting pad 3 and wiring conductor 7 are made of a metal material, such as copper, gold, aluminum, nickel, chromium, molybdenum or titanium, or their alloy. For example, the imaging device connecting pad 3 and wiring conductors 7 are formed by transferring a copper foil that has been machined to a wire conductor shape onto a resin sheet made of a glass epoxy resin, laminating resin sheets on which the copper foil has been transferred, and bonding the laminated resin sheets by using an adhesive. Of the internal conductors, each through-conductor, which passes through the resin sheet in its thickness direction, may be formed in an adhering manner on an inner surface of the through-hole formed in the resin sheet by a printing or plating method of a conductive paste or by filling the through-hole. Alternatively, the through-conductor may be formed by integrating a meal foil or metal pillar to the insulating base body 2 made of a resin or by attaching it to the insulating base body 2 by a sputtering method, an evaporation method, a plating method, or the like.

A plurality of imaging device connecting pads 3, which are formed on the upper surface of the insulating base body 2, are electrically connected to the electrodes of the imaging device 10 through bonding wires 6 passing through the through-hole 5.

The imaging device 10 is accommodated in the recess 4. The imaging device 10 has a plurality of electrodes. Each electrode of the imaging device 10 is electrically connected through a bonding wire 6 to one of the plurality of imaging device connecting pads 3 formed on the upper surface of the insulating base body 2. Accordingly, even if the imaging device accommodating package 1 has been deformed by an external force applied to the imaging device accommodating package 1, electric connections between the imaging device accommodating package 1 and the imaging device 10 are less likely to be broken due to the bonding wires 6, so it is possible to achieve the imaging device accommodating package 1 with improved connection reliability.

The imaging device connecting pads 3 may be disposed on the inner surfaces of the through-hole 5 formed in the insulating base body 2. If the imaging device connecting pads 3 are disposed on the inner surfaces of the through-hole 5, an area in which the imaging device connecting pads 3 are disposed on the upper surface of the insulating base body 2 can be eliminated, so a wide area in which capacitors and the like are mounted can be allocated. Since an area in which the imaging device connecting pads 3 are disposed can be eliminated, the imaging device accommodating package can be made compact.

The imaging device accommodating package 1 in this embodiment has the insulating base body 2 that includes a lower surface including the recess 4, includes the through-hole 5 formed in the bottom surface of the recess 4 in a perspective plan view, and includes the bonding area 4b on the bottom surface of the recess 4, the bonding area 4b being used for the imaging device 10. The imaging device accommodating package 1 also has the imaging device connecting pads 3 formed on the upper surface of the insulating base body 2 or on the inner surfaces of the through-hole 5. These enable, for example, the imaging device accommodating package 1 and imaging device 10 be bonded by using the bonding material 13, and enables the imaging device accommodating package 1 and imaging device 10 to be electrically connected through the bonding wires 6 by using the imaging device connecting pads 3 formed on the upper surface of the insulating base body 2 or on the inner surfaces of the through-hole 5. Accordingly, the height of the side walls of the recess 4 in the insulating base body 2 can be lowered by using the bonding material 13 with a thickness of, for example, 5 to 20 μm instead of bumps with a height of, for example, 50 to 100 μm and connection electrodes, which have been present between the insulating base body 2 and the imaging device 10, enabling the profile of the imaging device accommodating package 1 to be lowered. Even if the imaging device accommodating package 1 has been deformed by an external force applied to the imaging device accommodating package 1, electric connections between the imaging device accommodating package 1 and the imaging device 10 are less likely to be broken due to the bonding wires 6, so it is possible to achieve an imaging device accommodating package 1 with improved connection reliability.

Next, the method of manufacturing the imaging device accommodating package 1 in this embodiment will be described.

The insulating base body 2 is made of, for example, a aluminum oxide ($Al_2O_3$) sintered body. As for this insulating base body 2, a ceramic green sheet intended for simultaneous manufacturing is obtained by the method described above.

By using this ceramic green sheet, the imaging device accommodating package 1 is manufactured through processes (1) to (5) below.

(1) Punching process using a punching mold for portions where the side walls of the recess 4 and the through-hole 5 in the insulating base body 2 are formed.

(2) Printing application process of a conductive paste to form the imaging device connecting pads 3 on a portion that becomes the upper surface of the insulating base body 2 and to form the wiring conductors 7, each of which includes a through-conductor, such as a via-hole conductor or a through-hole conductor, that extends from the upper surface of the insulating base body 2 through the interior of the insulating base body 2 to a portion that becomes its lower surface.

(3) Process to manufacture a ceramic green sheet laminated body by laminating ceramic green sheets, each of which becomes an insulating layer.

(4) Process to obtain a sintered body having a recess 4 and a through-hole 5 by separating this ceramic green sheet laminated body into laminated bodies, each of which becomes an individual insulating base body 2, by cutting the ceramic green sheet laminated body.

(5) Process to attach metal plated layers to a plurality of imaging device connecting pads 3 and a plurality of wiring conductors 7. The metal plated layers protect the plurality of imaging device connecting pads 3 and the plurality of wiring conductors 7 exposed on the lower surfaces of the insulating base body 2, prevent them from being oxidized, and simplify brazing.

Imaging device accommodating packages 1 can be manufactured all at once by simultaneous manufacturing, so they can be manufactured at a lower cost and are more versatile when compared with semiconductor packages that are of a type in which a metal frame body is placed on a substrate made of ceramics.

With the imaging device accommodating package 1 in this embodiment, when individual laminated bodies cut from a ceramic green sheet limited body are fired, individual imaging device connecting pads 3 and wiring conductors 7 are sintered and formed in an adhering manner. That is, a plurality of imaging device connecting pads 3 with thicknesses of 5 to 10 μm are formed on the upper surface of the insulating base body 2, and a plurality of wiring conductors 7 with thicknesses of 5 to 10 μm are formed so as to be exposed on the lower surface of the insulating base body 2.

Furthermore, to protect each electrode, prevent it from being oxidized, and perform brazing on the electrode easily and firmly, it is preferable to cover the surface of the electrode with a Ni-plated layer with a thickness of 0.5 to 10 μm or cover them with this Ni plated layer and a gold (Au) plated layer with a thickness of 0.5 to 2 μm sequentially.

When the imaging device 10 is accommodated on the bottom surface of the recess 4 in the imaging device accommodating package 1 formed as described above, the imaging device 10 is bonded to the bonding area 4b on the bottom surface of the recess 4 by using the bonding material 13 such as a bonding resin, and the imaging device 10 is electrically connected to the imaging device connecting pads 3 by using the bonding wires 6 in such a way that they pass through the through-hole 5, the imaging apparatus is formed. The bonding material 13 is made of a resin such as epoxy resin. The bonding material 13 is preferably bonded directly to the bonding area 4b on the bottom surface of the recess 4, that is, the surface of the insulating base body 2.

The imaging device 10 is a semiconductor device such as a CCD-type imaging device or a CMOS-type imaging device. As the bonding wire 6, a bonding wire made of gold (Au) or the like is used. When the imaging device 10 is bonded to the bonding area 4b on the bottom surface of the recess 4 in the insulating base body 2 by using the bonding material 13 such as a boding resin as described above, the effect of heat dissipation from the imaging device 10 is obtained.

Figure 2:
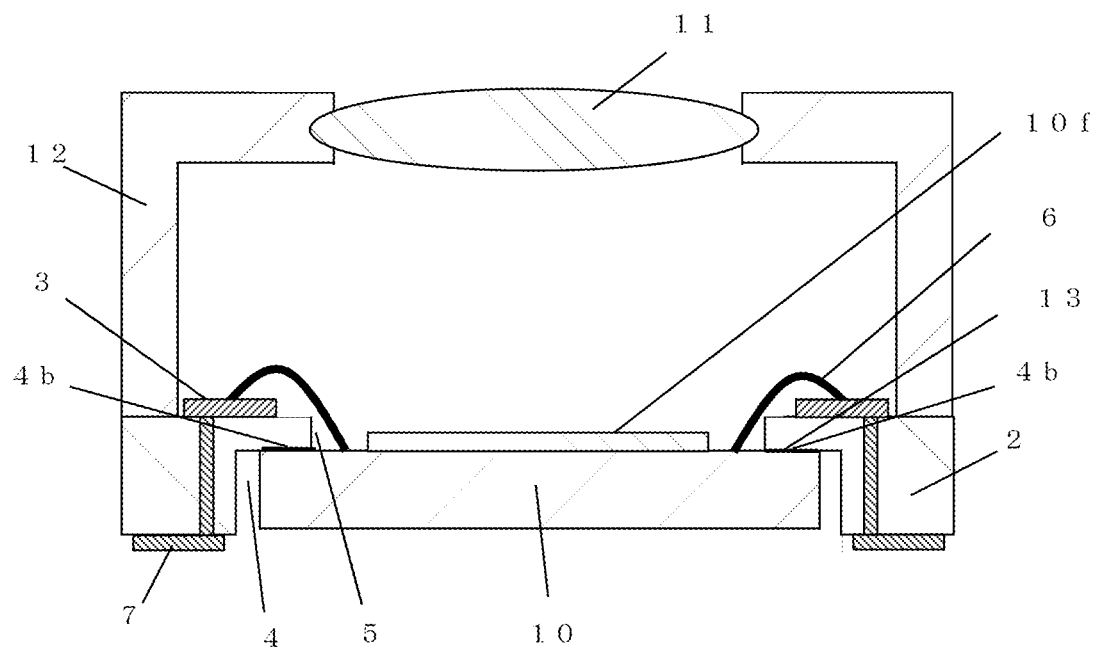
FIG. 2 is a cross-sectional view illustrating an example of the imaging apparatus in the first embodiment of the present invention.

With the imaging apparatus in this embodiment, a lens 11 is placed above the through-hole 5 in the insulating base body 2 of the imaging apparatus having the above structure, as shown in the example in FIG. 2. This structure enables a thin imaging apparatus to output image signals with high image quality. The lens 11, which is made of glass or a resin such as epoxy resin, is attached to a lens fixing member 12. The lens 11 can direct light that has been transmitted through the lens 11 through an opening in the lens fixing member 12 to a light receiving part 10f. The lens fixing member 12, which is made of a resin, a metal or the like, is fixed to the upper surface of the insulating base body 2 by using an adhesive such as epoxy resin or a solder, as shown in the example in FIG. 2. Alternatively, the lens fixing member 12 is fixed to the insulating base body 2 with, for example, a hook attached to the lens fixing member 12 in advance.

Figure 3:
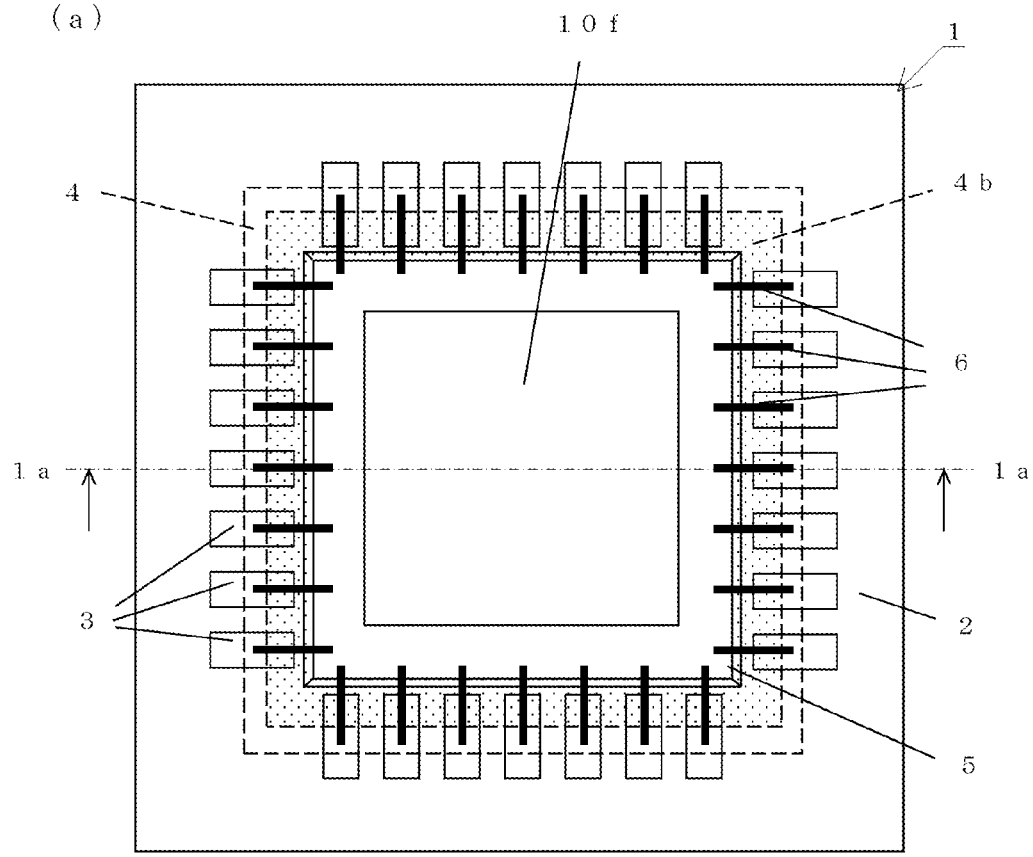
FIG. 3(a) is a perspective plan view illustrating another example of the imaging apparatus in the first embodiment of the present invention.
FIG. 3(b) is a cross-sectional view as taken along line 1a-1a in FIG. 3(a)
FIG. 3(c) is an enlarged cross-sectional view of a portion 1b, in FIG. 3(b), of the imaging apparatus.
Figure 3:
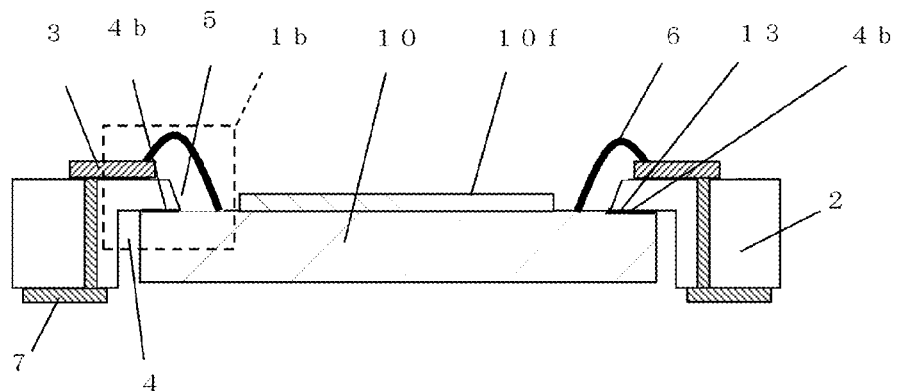
Figure 3:
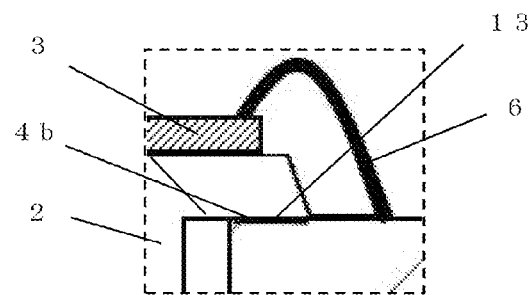
Figure 5:
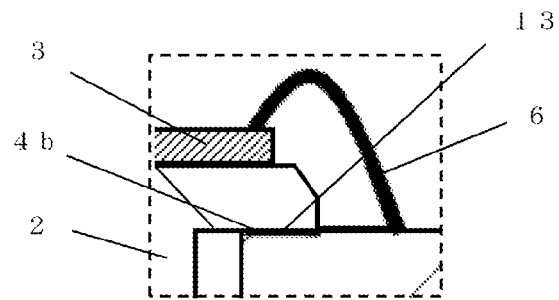
FIGS. 5(a) to 5(c) are enlarged cross-sectional views of main elements illustrating the other example of the imaging apparatus in the first embodiment of the present invention.
Figure 5:
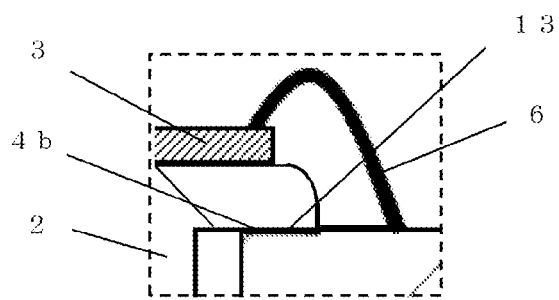
Figure 5:
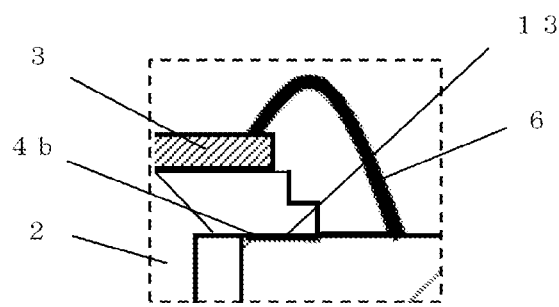

If the width of the opening of the through-hole 5 on the upper surface side of the insulating base body 2 is larger than the width of the opening of the through-hole 5 on the lower surface side of the insulating base body 2 as shown in FIG. 3, this is preferable because when the imaging device connecting pads 3 and imaging device 10 are connected by using the bonding wires 6 in such a way that they pass through the through-hole 5, it is efficiently prevented that a capillary used for wire bonding collides with the through-hole 5. Although, with the imaging apparatus in this embodiment, the inner surfaces of the through-hole 5 are inclined, only part of each inner surface of the through-hole 5 may be inclined as shown in FIG. 5(a). This is also preferable in this case as well because when the imaging device connecting pads 3 and imaging device 10 are connected by using the bonding wires 6 in such a way that they pass through the through-hole 5, it is efficiently prevented that a capillary used for wire bonding collides with the through-hole 5.

With the imaging apparatus in this embodiment, if an angle formed by the inclination of an inner surface of the through-hole 5 or a virtual extended surface of the inclined portion of the inner surface of the through-hole 5 and the bottom surface of the recess 4 is X degrees, X is preferably at least 45 and at most 85. If X is at least 45, the thickness of a portion formed by the inner surfaces of the recess 4 and the bottom surface of the recess 4 does not become small, so a crack, a chip, or another problem is not easily caused on the inner surfaces of the recess 4 by an external force during the handling of the imaging device accommodating package 1. If X is at most 85, when the imaging device connecting pads 3 and imaging device 10 are connected by using the bonding wires 6 in such a way that they pass through the through-hole 5, it is efficiently prevented that a capillary used for wire bonding collides with the through-hole 5, so reliability in electrical connection between the imaging device accommodating package 1 and the imaging device 10 is further increased. It is also efficiently prevented that a capillary used for wire bonding collides with the through-hole 5 and a chip or the like occurs in the insulating base body 2.

As the through-hole 5 having an inclination on each inner surface, a through-hole is formed so that each inner surface of a through-hole formed in a ceramic green sheet is expanded from one main surface of the ceramic green sheet toward another main surface at an angle θ between 45 degrees and 85 degrees. If a through-hole is formed so that its inner surface is expanded from one main surface of the ceramic green sheet toward another main surface at the angle θ between 45 degrees and 85 degrees as described above, the through-hole 5 can be formed so that an angle formed by its inner surface and the bottom surface of the recess 4 becomes the angle θ between 45 degrees and 85 degree.

Figure 4:
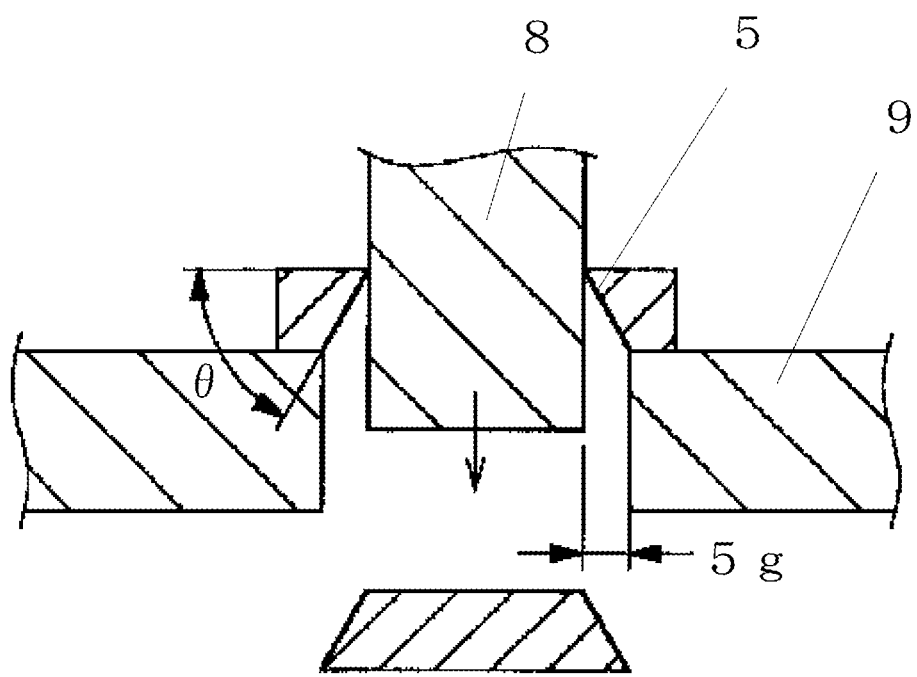
FIG. 4 is a cross-sectional view illustrating a method of forming a through-hole in a ceramic green sheet in a manufacturing method in an example of an imaging device accommodating package in the first embodiment of the present invention.

To form a through-hole so that its inner surface is expanded from one main surface of the ceramic green sheet toward another main surface at the angle θ between 45 degrees and 85 degrees as described above, a clearance 5g, which is part of a clearance between a punch 8 and a die 9 of a punching mold is preferably set to be large as shown in the cross sectional view in FIG. 4, which is given to explain a method of forming a through-hole, and the ceramic green sheet is then punched. A mold or an elastic body, such as rubber, that has an inclined part is preferably pressed against the through-hole 5, as necessary. If the thickness of the ceramic green sheet is, for example, about 0.5 mm, the clearance 5g, which is part of the punching mold, is set to about 0.2 to 0.5 mm and the ceramic green sheet is then punched, after which a mold or an elastic body, such as rubber, that has an inclined part with a desired inclination angle is pressed against the through-hole 5 so that the angle θ is further reduced. Thus, the angle θ can be set to 45 degrees to 85 degrees. The ceramic green sheet described above may be a lamination of a plurality of ceramic green sheets. From the viewpoint of productivity, the plurality of ceramic green sheets are preferably laminated to a thickness equivalent to the thickness of the bottom surface of the recess 4 in the insulating base body 2 before they are punched. To incline only part of the inner surface of the through-hole 5 as shown in FIG. 5(a), it suffices to combine a ceramic green sheet that has an inclination in a portion that becomes part of the inner surface of the through-hole 5 and a ceramic green sheet that has no inclination in a portion that becomes another part of the inner surface of the through-hole 5.

Alternatively, a curved surface or a step may be provided on each inner surface of the through-hole 5 instead of an inclination as shown in FIGS. 5(b) and 5(c) so that the width of the through-hole 5 on the upper surface side of the insulating base body 2 becomes larger than that on the lower surface side of the insulating base body 2. This is preferable in this case as well because when the imaging device connecting pads 3 and imaging device 10 are connected by using the bonding wires 6 in such a way that they pass through the through-hole 5, it is efficiently prevented that a capillary used for wire bonding collides with the through-hole 5. If a step is provided on each inner surface of the through-hole 5 and imaging device connecting pads 3 are placed on the upper surface of the step, this is preferable because each imaging device connecting pad 3 can be formed at a place closer to the imaging device 10 and the bonding wire 6 can be thereby shortened, so electric characteristics can be improved. If a curved surface is provided on each inner surface of the through-hole 5 as shown in FIG. 5(b), the ceramic green sheet may be punched by a punching mold before a mold or an elastic body, such as rubber, that has a curved surface is pressed against the through-hole 5. If a step is provided on each inner surface of the through-hole 5 as shown in FIG. 5(c), a ceramic green sheet that has been punched with a punching mold and a ceramic green sheet that has been punched with a punching mold so that it has an opening with a different width from the above ceramic green sheet may be combined. The ceramic green sheet described above may be a lamination of a plurality of ceramic green sheets.

Second Embodiment

An imaging apparatus in a second embodiment of the present invention will be described with reference to FIGS.

6(a) and 6(b). The imaging apparatus in this embodiment differs from the first embodiment in the structure of the through-hole 5. In the structure in this embodiment, the width of the opening of the through-hole 5 on the lower surface side of the insulating base body 2 is larger than the width of the opening of the through-hole 5 on the upper surface side of the insulating base body 2. In this embodiment, an inclination is provided on the inner surfaces of the through-hole 5.

With the imaging apparatus in this embodiment, if an angle formed by the inclination of an inner surface of the through-hole 5 or a virtual extended surface of the inclined portion of the inner surface of the through-hole 5 and the upper surface of the insulating base body 2 is X degrees, X is preferably at least 45 and at most 85. If X is at least 45, the thickness of a portion formed by the inner surfaces of the recess 4 and the upper surface of the insulating base body 2 does not become small, so a crack, a chip, or another problem is not easily caused on the inner surfaces of the recess 4 by an external force during the handling of the imaging device accommodating package 1. If X is at most 85, when the imaging device 10 and imaging device accommodating package 1 are bonded by using the bonding material 13 made of a resin such as epoxy resin, the amount of the bonding material 13 formed between each inner surface of the through-hole 5 and the imaging device 10 becomes adequate. As a result, a large amount of the bonding material 13 stays on the inclination of each inner surface of the through-hole 5 and a large lump of the bonding material 13 is formed, so reliability in bonding between the imaging device 10 and the imaging device accommodating package 1 is improved. It is also efficiently prevented that a capillary used for wire bonding collides with the through-hole 5 and a chip or the like occurs in the insulating base body 2.

A through-hole having an inclination on each inner surface of the through-hole 5 may be formed in the same way as in the first embodiment so that the width of the opening of the through-hole 5 on the lower surface side of the insulating base body 2 is larger than the width of the through-hole 5 on the upper surface side of the insulating base body 2.

Figure 6:
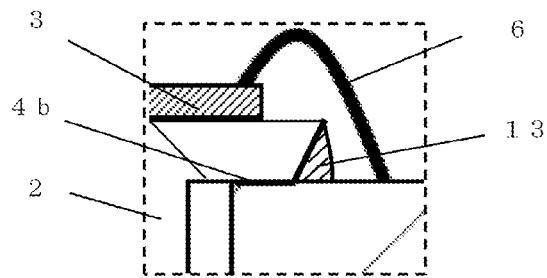
FIG. 6(a) is an enlarged cross-sectional view of main elements illustrating an example of an imaging apparatus in a second embodiment of the present invention.
FIGS. 6(b) to 6(d) are enlarged cross-sectional views of main elements illustrating other examples of the imaging apparatus in the second embodiment of the present invention.
Figure 6:
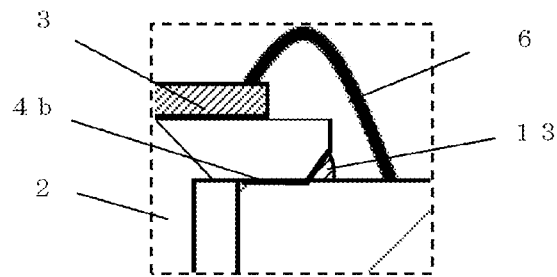
Figure 6:
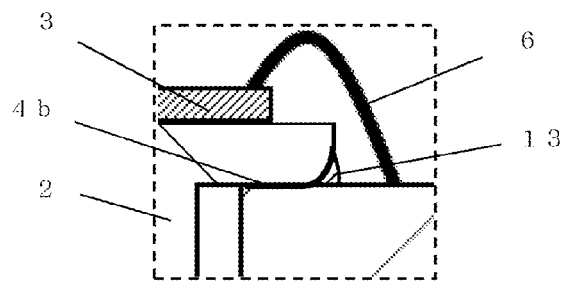
Figure 6:
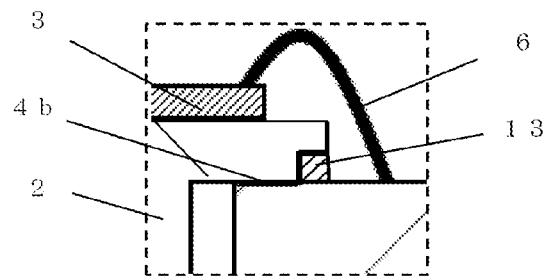

Alternatively, a curved surface or a step may be provided on each inner surface of the through-hole 5 instead of an inclination as shown in FIGS. 6(c) and 6(d) so that the width of the opening of the through-hole 5 on the lower surface side of the insulating base body 2 becomes larger than the width of the opening of the through-hole 5 on the upper surface side of the insulating base body 2. This is preferable in this case as well because when the imaging device 10 and imaging device accommodating package 1 are bonded by using the bonding material 13 made of a resin such as epoxy resin, the amount of the bonding material 13 formed between each inner surface of the through-hole 5 and the imaging device 10 becomes adequate, and the result is that a large amount of the bonding material 13 stays on the inclination of each inner surface of the through-hole 5 and that a large lump of the bonding material 13 is formed, so reliability in bonding between the imaging device 10 and the imaging device accommodating package 1 is improved.

If the width of the opening of the through-hole 5 on the lower surface side of the insulating base body 2 is larger than the width of the opening of the through-hole 5 on the upper surface side of the insulating base body 2 as described above, the imaging device connecting pads 3 are preferably disposed in portions that do not overlap the inner surfaces of the through-hole 5 in a perspective plan view so that a chip, a crack, or the like is not easily caused by stress during wire bonding.

Third Embodiment

Figure 7:
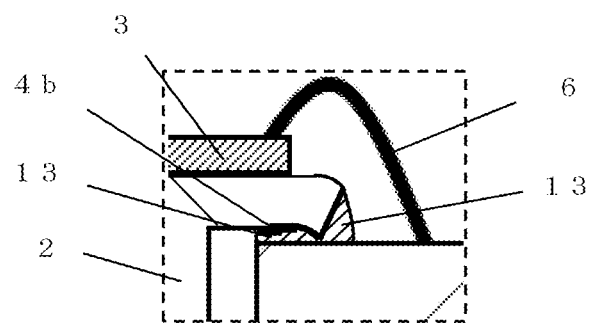
FIG. 7(a) is an enlarged cross-sectional view of main elements illustrating an example of an imaging apparatus in a third embodiment of the present invention.
FIG. 7(b) is an enlarged cross-sectional view of main elements illustrating another example of the imaging apparatus in the third embodiment of the present invention.
Figure 7:
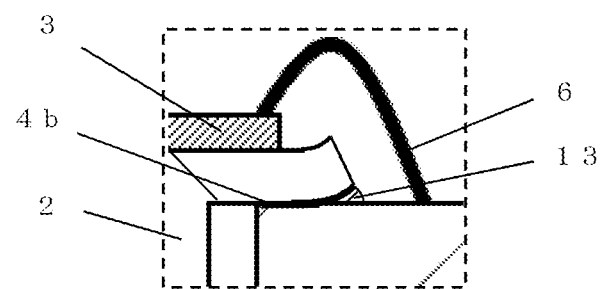

An imaging apparatus in a third embodiment of the present invention will be described with reference to FIG. 7. The imaging apparatus in this embodiment differs from the above embodiments in the structure of the through-hole 5. In the structure in this embodiment, the periphery of the through-hole 5 in the insulating base body 2 is curved in a longitudinal cross-sectional view. If the periphery of the through-hole 5 in the insulating base body 2 is curved in a longitudinal cross-sectional view as described above, when the imaging device 10 and imaging device accommodating package 1 are bonded by using the bonding material 13 made of a such as epoxy resin, the amount of the bonding material 13 formed between the bonding area 4b of the imaging device accommodating package 1 and the imaging device 10 becomes adequate. As a result, a large amount of the bonding material 13 stays on the bonding area 4b and a large lump of the bonding material 13 is formed, so reliability in bonding between the imaging device 10 and the imaging device accommodating package 1 is improved. If the periphery of the through-hole 5 in the insulating base body 2 is curved toward the lower surface of the insulating base body 2 in a longitudinal cross-sectional view, this is preferable because when the imaging device connecting pads 3 and imaging device 10 are connected by using the bonding wires 6 in such a way that they pass through the through-hole 5, it is efficiently prevented that a capillary used for wire bonding collides with the through-hole 5.

Fourth Embodiment

Figure 8:
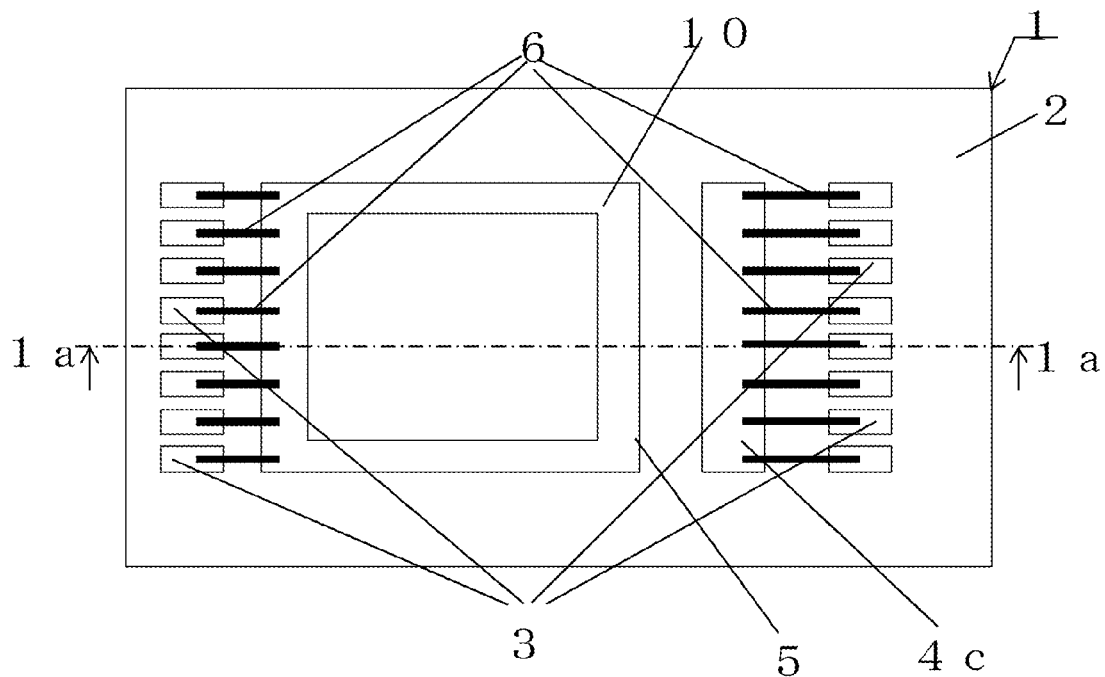
FIG. 8(a) is a perspective plan view illustrating an example of an imaging apparatus in a fourth embodiment of the present invention.
FIG. 8(b) is a cross-sectional view as taken along line 1a-1a in FIG. 8(a).
Figure 8:
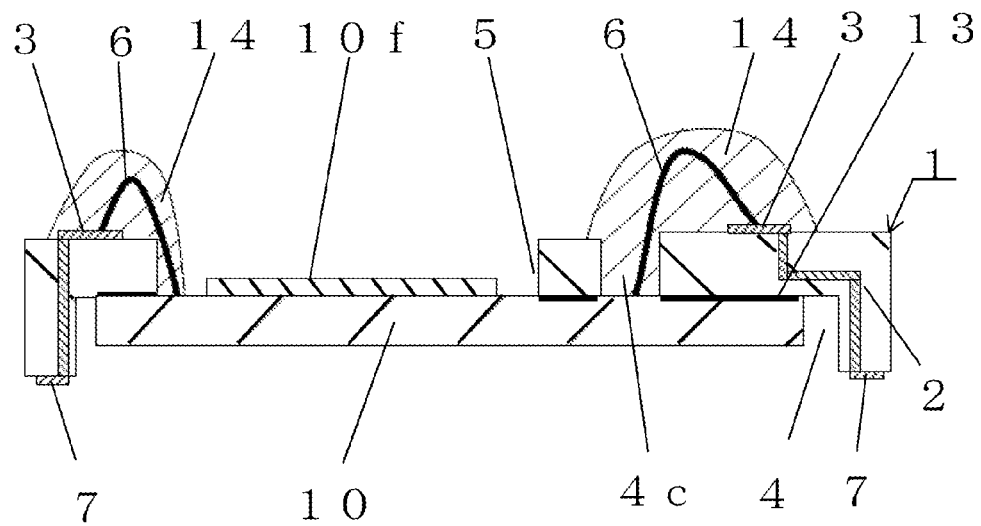
Figure 9:
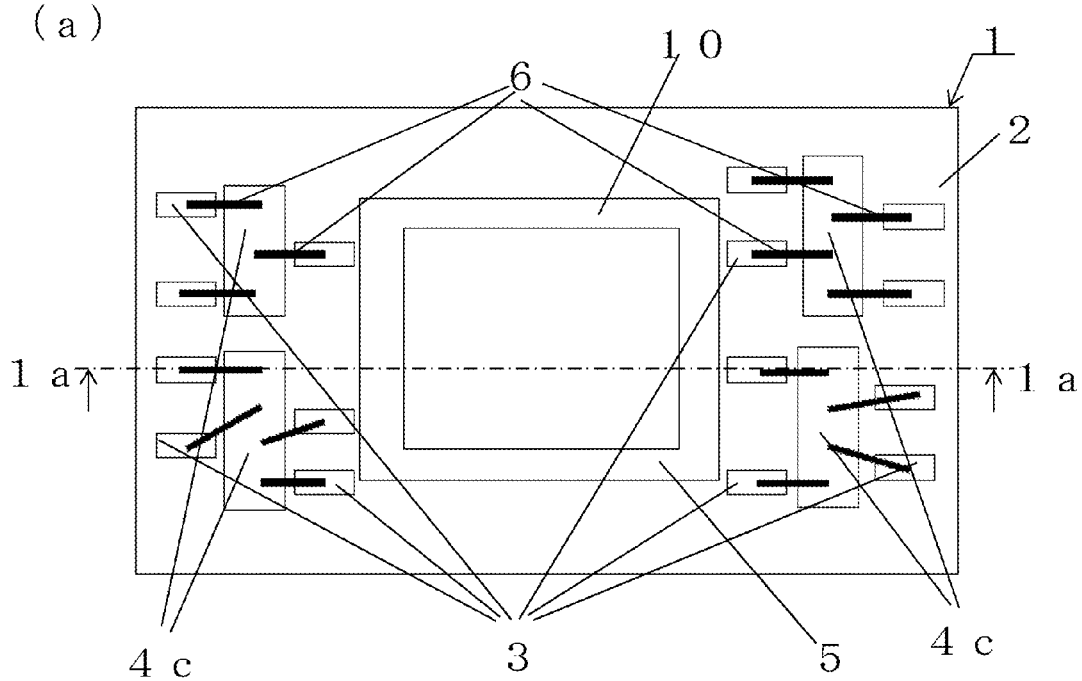
FIG. 9(a) is a perspective plan view illustrating another example of the imaging apparatus in the fourth embodiment of the present invention.
FIG. 9(b) is a cross-sectional view as taken along line 1a-1a in FIG. 9(a).
Figure 9:
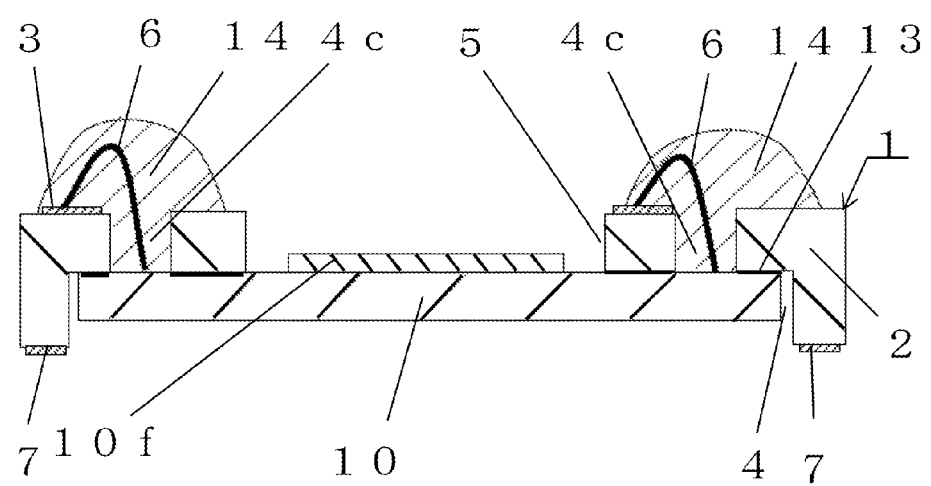

An imaging apparatus in a fourth embodiment of the present invention will be described with reference to FIG. 8. The imaging apparatus in this embodiment differs from the above embodiments in the structure of the insulating base body 2. In the structure in this embodiment, the imaging device connecting pads 3 are disposed on the upper surface of the insulating base body 2 and the insulating base body 2 has a hole 4c formed between the through-hole 5 and the imaging device connecting pads 3. If the insulating base body 2 has the hole 4c formed between the through-hole 5 and the imaging device connecting pads 3 as described above, when, for example, the light receiving part 10f of the imaging device 10 is placed eccentrically or a signal processing unit 10s is placed in the imaging device 10, the imaging apparatus can be preferably used in a case, for example, in which the electrodes of the imaging device 10 are placed away from the light receiving part 10f. When the imaging device 10 and imaging device accommodating package 1 are bonded by using the bonding material 13 made of a resin such as epoxy resin, the bonding material 13 stays in the hole 4c, efficiently preventing the bonding material 13 flowing into the light receiving part 10f formed in the imaging device 10. If the imaging device connecting pads 3 are placed between the through-hole 5 and the hole 4c in a plan view, this is preferable because the imaging device accommodating package 1 and imaging apparatus can be made compact. Furthermore, if the imaging device connecting pads 3 are placed between the through-hole 5 and a hole 4c and outside the hole 4c in a plan view as shown in FIG. 9, this is preferable because a clearance between each two imaging device connecting pads 3 can be expanded and a short-circuit can be thereby efficiently prevented between the two imaging device connecting pads 3 and because a high density of imaging device connecting pads 3 can be achieved and the imaging apparatus can be thereby made compact. To form the hole 4c between the through-hole 5 and the imaging device connecting pads 3 in a plan view, a ceramic green sheet may be punched at a portion where to form the hole 4c by using a punching mold in the same way as with the side walls of the recess 4 and the through-hole 5 in the insulating base body 2.

Fifth Embodiment

Figure 10:
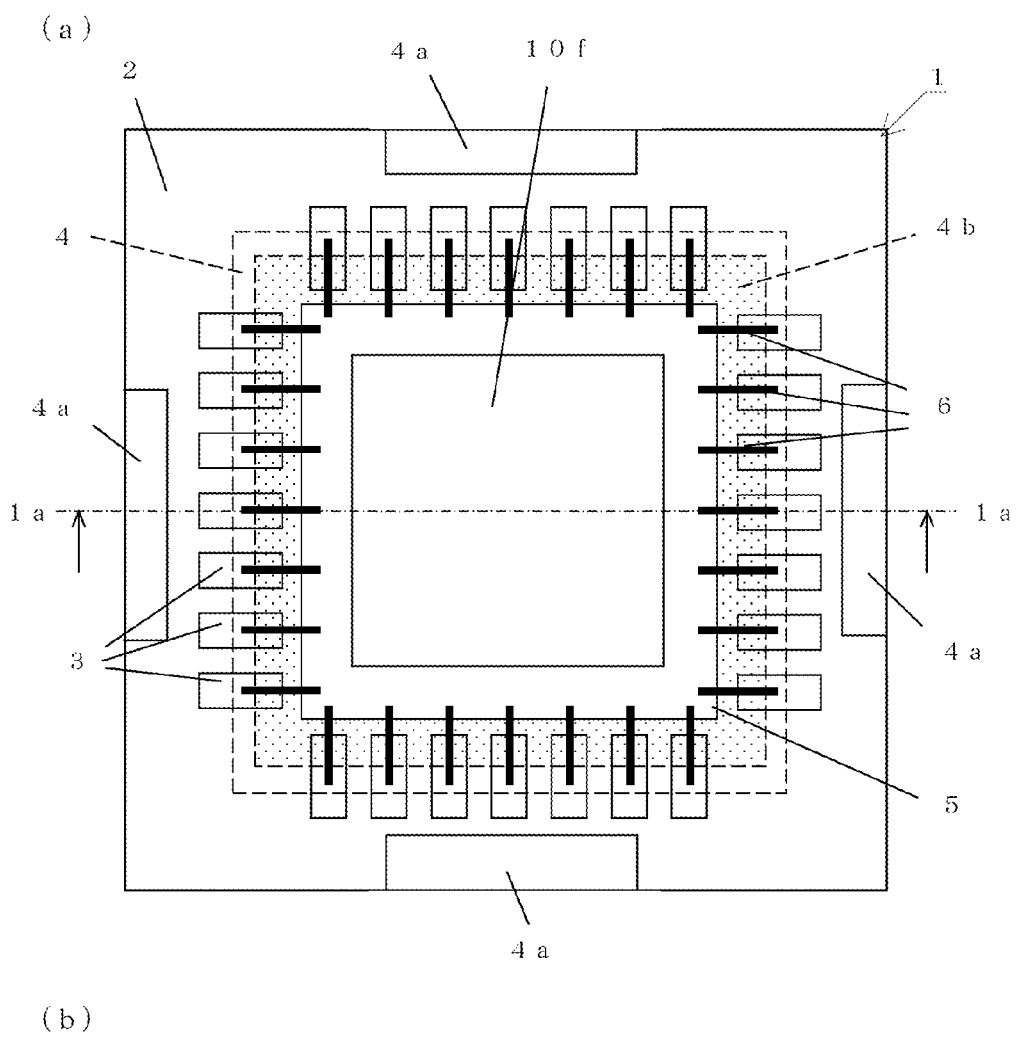
FIG. 10(a) is an enlarged cross-sectional view of main elements illustrating an example of an imaging apparatus in a fifth embodiment of the present invention.
FIG. 10(b) is a cross-sectional view as taken along line 1a-1a in FIG. 10(a).
Figure 10:
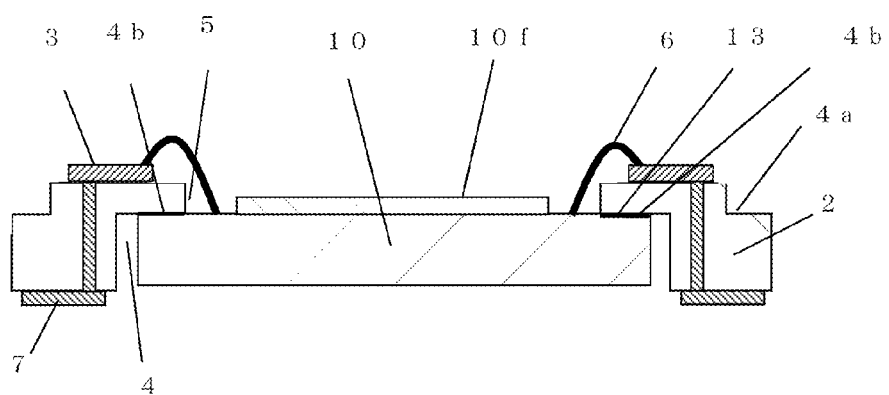

An imaging apparatus in a fifth embodiment of the present invention will be described with reference to FIG. 10. The imaging apparatus in this embodiment differs from the above embodiments in the structure of the insulating base body 2. In the structure in this embodiment, the insulating base body 2 has notches 4a in the upper surface. If the insulating base body 2 has the notches 4a in the upper surface as described above, this is preferable because the lens fixing member 12 can be highly precisely positioned horizontally on the imaging device accommodating package 1. If the same mold is used to form the through-hole 5 in the insulating base body 2 and the notches 4a at the same time, this is preferable because the positioning of the imaging device 10 during bonding to the imaging device accommodating package 1 with respect to the through-hole 5 and the positioning of the lens fixing member 12 with reference to the notches 4a can be highly precisely performed. If the notches 4a are formed at corners of the upper surface of the insulating base body 2, even when an external force is applied to the lens fixing member 12, stress concentrates, through the hook of the lens fixing member 12, on the corners of the insulating base body 2 at which the notches 4a are formed, so the entire of the insulating base body 2 is less likely to be deformed, making it difficult to break electrical connections between the imaging device accommodating package 1 and the imaging device 10.

Sixth Embodiment

Figure 11:
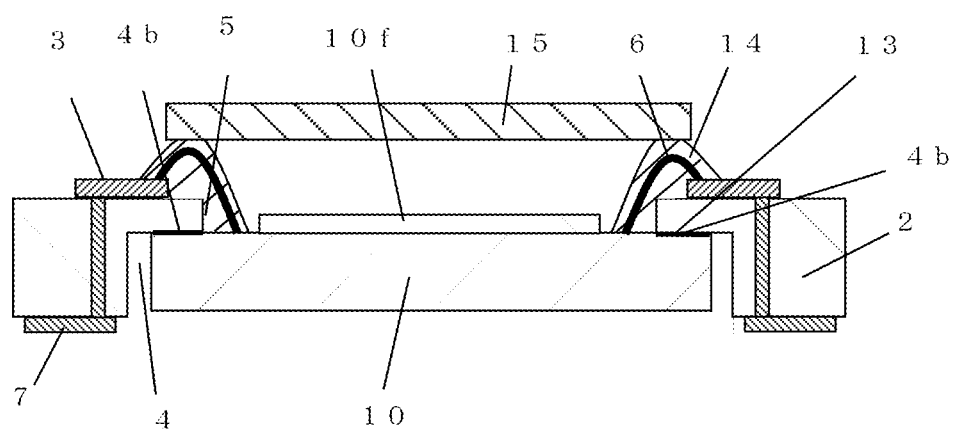
FIG. 11 is a cross-sectional view illustrating an example of an imaging apparatus in a sixth embodiment of the present invention.

An imaging apparatus in a sixth embodiment of the present invention will be described with reference to FIG. 11. With the imaging apparatus in this embodiment, each bonding wire 6 is covered with a first insulting member 14 such as a resin. If the bonding wire 6 is covered with the first insulting member 14 such as a resin as described above, the bonding wire 6 is secured with the first insulating member 14, so electrical connections between the imaging device accommodating package 1 and the imaging device 10 are further less likely to be broken. In addition, if a light transmitting plate 15 is further provided on the upper surface side of the insulating base body 2 at a distance from the upper surface of the insulating base body 2 and the light transmitting plate 15 abuts the first insulting member 14, this is preferable because the profile of the imaging apparatus can be reduced as compared with the case in which the light transmitting plate 15 is disposed on the insulating base body 2 above the through-hole 5 in the insulating base body 2 of the imaging apparatus by using a fixing member for use with the light transmitting plate 15.

Seventh Embodiment

Figure 12:
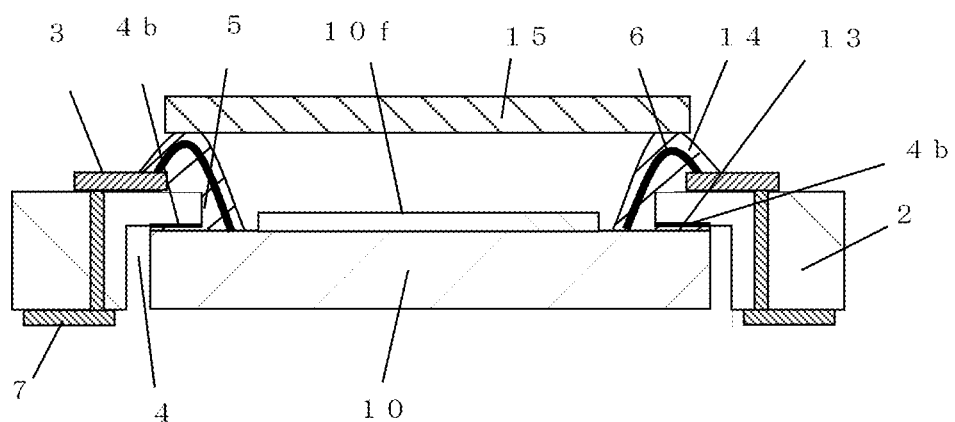
FIG. 12 is a cross-sectional view illustrating an example of an imaging apparatus in a seventh embodiment of the present invention.

An imaging apparatus in a seventh embodiment of the present invention will be described with reference to FIG. 12. With the imaging apparatus in this embodiment, the bonding area 4b of the insulating base body 2 and the imaging device 10 are bonded by using the bonding material 13, and the first insulting member 14 and bonding material 13 are made of the same material, which is, for example, epoxy resin. If the first insulting member 14 and bonding material 13 are made of the same material as described above, this is preferable because the imaging device 10 and light transmitting plate 15 can be bonded to the imaging device accommodating package 1 at the same time and processes can be simplified.

Eighth Embodiment

Figure 13:
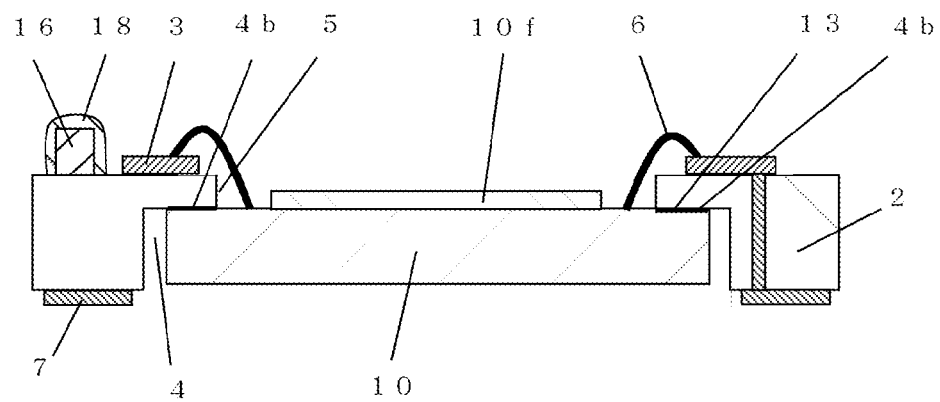
FIG. 13(a) is a cross-sectional view illustrating an example of an imaging apparatus in an eighth embodiment of the present invention.
FIG. 13(b) is a cross-sectional view illustrating another example of the imaging apparatus in the eighth embodiment of the present invention.
Figure 13:
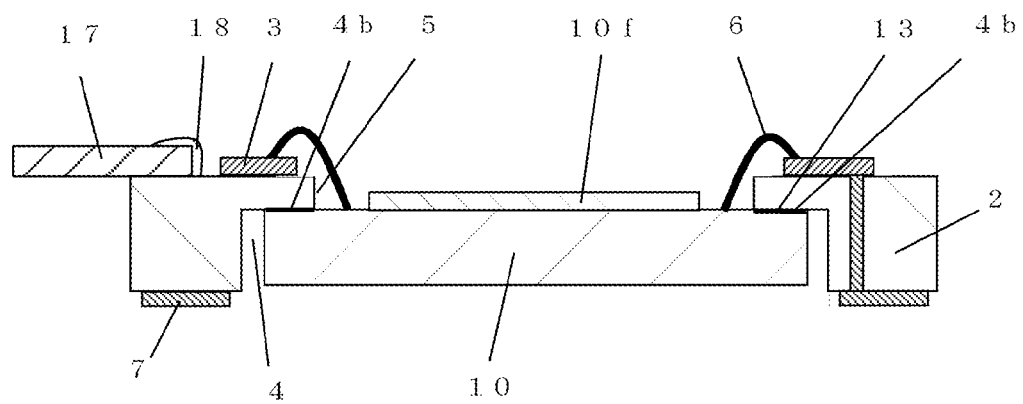

An imaging apparatus in an eighth embodiment of the present invention will be described with reference to FIG. 13. The imaging apparatus in this embodiment further has an electric part 16 or a wiring board 17 on the upper surface of the insulating base body 2. The electric part 16 or wiring board 17 is attached to the insulating base body 2 and is covered with a second insulating member 18, which is made of a resin such as epoxy resin. If the electric part 16 or wiring board 17 is covered with the second insulating member 18 attached to the insulating base body 2 as described above, reliability in the mounting of the electric part 16 or wiring board 17 on the upper surface of the insulating base body 2 is improved. If the whole of the electric part 16 is covered with the second insulating member 18 attached to the insulating base body 2, this is preferable because a short-circuit to the electric part 16 can be prevented. In addition, the second insulating member 18 may be formed so that it becomes higher than the bonding wire 6 and the light transmitting plate 15 may be bonded onto the second insulating member 18.

Ninth Embodiment

Figure 14:
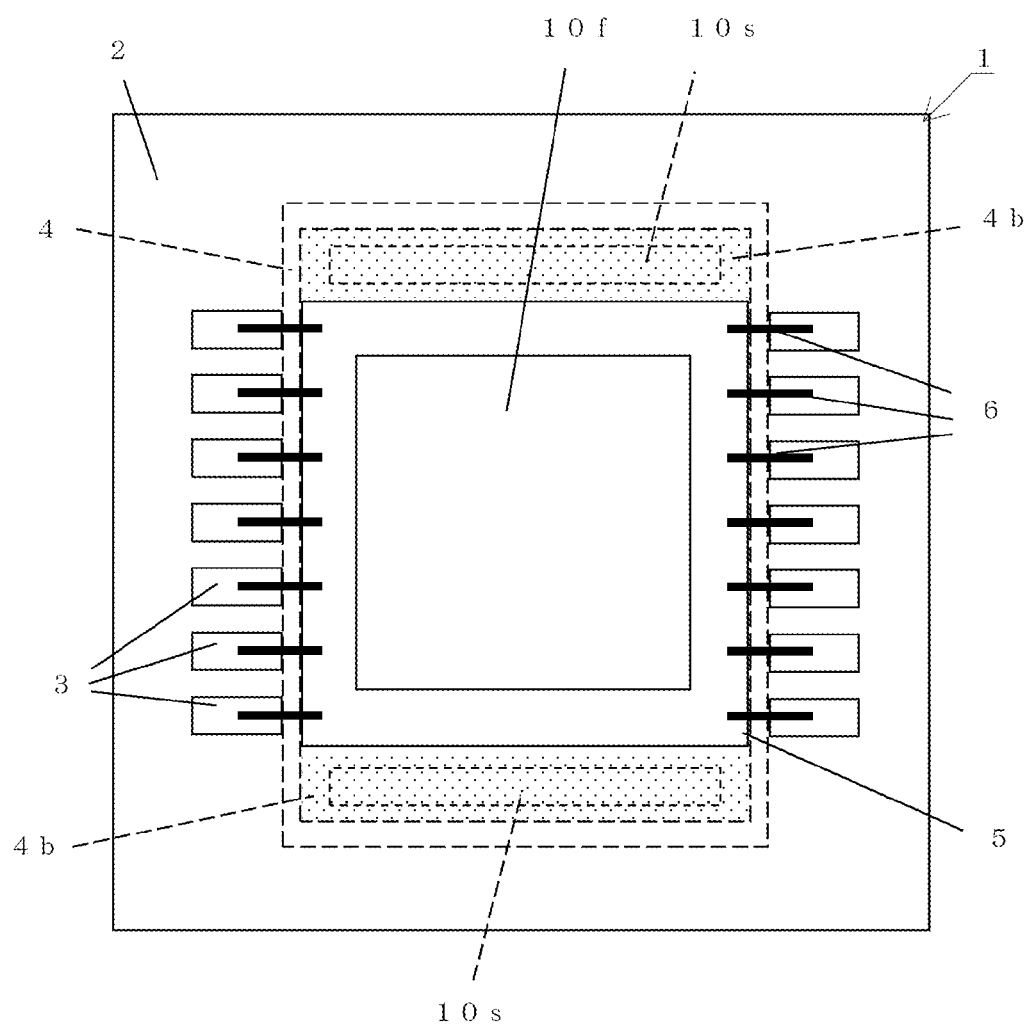
FIG. 14 is a perspective plan view illustrating an example of an imaging apparatus in a ninth embodiment of the present invention.

An imaging apparatus in a ninth embodiment of the present invention will be described with reference to FIG. 14. With the imaging apparatus in this embodiment, the outside shape of the through-hole 5 is rectangular in a perspective plan view, the imaging device connecting pads 3 are disposed in correspondence to a pair of sides of the rectangular through-hole 5, and the imaging device 10 is electrically connected to the imaging device connecting pads 3 at portions corresponding to the pair of sides of the through-hole 5 and is bonded to an area, on the insulating base body 2, that corresponds to another pair of sides of the through-hole 5. If the imaging device 10 is electrically connected to the imaging device connecting pads 3 at the portions corresponding to the pair of sides of the through-hole 5 and is bonded to the area, on the insulating base body 2, that corresponds to the other pair of sides of the through-hole 5 as described above, when the imaging device 10 and imaging device accommodating package 1 are bonded by using the bonding material 13 made of a resin such as epoxy resin, the electrodes of the imaging device 10 and the bonding material 13 are placed at separate positions, so when the imaging device connecting pads 3 and imaging device 10 are connected by using the bonding wires 6, the imaging device connecting pads 3 can be superiorly wire-bonded to the electrodes of the imaging device 10. Signal processing units 10s are further formed in the imaging device 10. If the signal processing unit 10s and bonding area 4b of the imaging device 10 overlap each other in a perspective plan view, when the signal processing units 10s operate and generates heat, the heat is dissipated to the bonding material 13 or the imaging device accommodating package 1, so the imaging device 10 operates stably.

Tenth Embodiment

Figure 15:
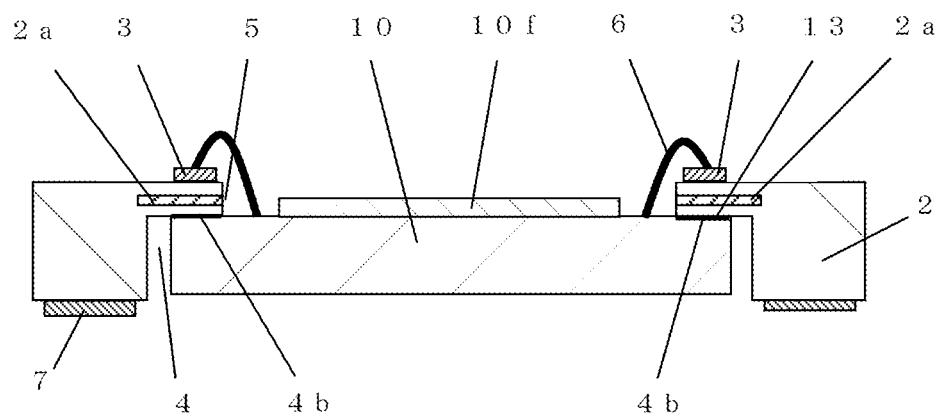
FIG. 15 is a cross-sectional view illustrating an example of an imaging apparatus in a tenth embodiment of the present invention.

An imaging apparatus in a tenth embodiment of the present invention will be described with reference to FIG. 15. With the imaging apparatus in this embodiment, the imaging device connecting pads 3 and imaging device 10 overlap each other in a perspective plan view. If the imaging device connecting pads 3 and imaging device 10 overlap each other in a perspective plan view as described above, when wire bonding to the imaging device connecting pads 3 is performed, the imaging device 10 placed so as to overlap the imaging device connecting pads 3 in a perspective plan view functions as a support, so the insulating base body 2 is less likely to be deformed. As a result, a crack can be made less likely to occur in the insulating base body 2. In addition, if reinforcing layers 2a are further provided in the insulating base body 2 so as to overlap the imaging device connecting pads 3 in a perspective plan view, when wire bonding to the imaging device connecting pads 3 is performed, stress in wire bonding is dispersed by the reinforcing layers 2a, so the insulating base body 2 is less likely to be deformed. Thus, it is possible to efficiently prevent a crack from occurring in the insulating base body 2. The imaging device connecting pads 3 and imaging device 10 can be formed at positions where they overlap each other in a perspective plan view by forming a ceramic green sheet for use with the through-hole 5, which was manufactured in the same way as for the ceramic green sheet for use with the insulating base body 2, or a metal paste including tungsten (W), molybdenum (Mo), manganese (Mn), silver (Ag), copper (Cu) or the like, which was manufactured in the same way as for the imaging device connecting pad 3, at positions, on the ceramic green sheet for use with the insulating base body 2, where the imaging device connecting pads 3 and imaging device 10 overlap each other and then firing the ceramic green sheet or metal paste.

The imaging device accommodating package 1 in an aspect of the present invention has an insulating base body 2 and imaging device connecting pads 3 formed on the upper surface of the insulating base body 2 or on the inner surfaces of a through-hole 5. The insulating base body 2 has a bottom surface including a recess 4 and has a through-hole 5 formed in the bottom surface of the recess 4 in a perspective plan view. The insulating base body 2 also has a bonding area 4b for use with the imaging device 10 on the bottom surface of the recess 4. These, for example, enable the imaging device accommodating package 1 and imaging device 10 to be bonded with a bonding material 13, and enables the imaging device accommodating package 1 and imaging device 10 to be electrically connected through bonding wires 6 by using the imaging device connecting pads 3 formed on the upper surface of the insulating base body 2 or on the inner surfaces of the through-hole 5. Accordingly, the height of the side walls of the recess 4 in the insulating base body 2 can be lowered by using the bonding material 13 instead of bumps and connection electrodes, which have been present between the insulating base body 2 and the imaging device 10, enabling the profile of the imaging device accommodating package 1 to be lowered.

In another aspect of the present invention, the imaging apparatus has the imaging device accommodating package 1 with the structure described above and the imaging device 10 accommodated in the imaging device accommodating package 1, so the profile of the imaging apparatus can be reduced.

REFERENCE SIGNS LIST 1 imaging device accommodating package
2 insulating base body
3 imaging device connecting pad
4 recess
4a notch
5 through-hole
6 bonding wire
7 wiring conductor

The invention claimed is:

1. An imaging device accommodating package comprising:
   an insulating base body including:
      a lower surface comprising a recess;
      a through-hole formed in a bottom surface of the recess in a perspective plan view, wherein a periphery of the through-hole is curved in a longitudinal cross-sectional view; and
      a bonding area on the bottom surface of the recess, the bonding area used for an imaging device; and
   an imaging device connecting pad formed on an upper surface of the insulating base body or on an inner surface of the through-hole.

2. The imaging device accommodating package according to claim 1, wherein a width of an opening of the through-hole on a lower surface side of the insulating base body is larger than a width of an opening of the through-hole on an upper surface side of the insulating base body.

3. The imaging device accommodating package according to claim 1, wherein the inner surface comprises an inclined surface, a curved surface, or a step.

4. The imaging device accommodating package according to claim 1, wherein:
   the imaging device connecting pad is disposed on the upper surface of the insulating base body; and
   the insulating base body comprises a hole formed between the through-hole and the imaging device connecting pad.

5. The imaging device accommodating package according to claim 1, wherein one imaging device connecting pad is disposed between the through-hole and the hole, and another imaging device connecting pad is disposed outside the hole in a plan view.

6. The imaging device accommodating package according to claim 1, wherein the insulating base body comprises a notch formed in the upper surface.

7. An imaging apparatus comprising:
   an imaging device accommodating package including:
      an insulating base body that includes:
         a lower surface including a recess;
         a through-hole formed in a bottom surface of the recess in a perspective plan view; and
         a bonding area on the bottom surface of the recess, the bonding area used for an imaging device; and
      an imaging device connecting pad formed on an upper surface of the insulating base body or on an inner surface of the through-hole; and
   an imaging device accommodated in the recess, the imaging device bonded to the bonding area, the imaging device electrically connected to the imaging device connecting pad by a bonding wire that passes through the through-hole;
   wherein the imaging device connecting pad and the imaging device overlap each other in a perspective plan view.

8. An imaging apparatus comprising:
   the imaging device accommodating package according to claim 7; and
   an imaging device accommodated in the recess, the imaging device bonded to the bonding area, the imaging device electrically connected to the imaging device connecting pad by a bonding wire that passes through the through-hole; wherein
   the inner surface of the through-hole and the imaging device are bonded with a bonding material.

9. An imaging apparatus comprising:
the imaging device accommodating package according to claim 7; and
an imaging device accommodated in the recess, the imaging device bonded to the bonding area, the imaging device electrically connected to the imaging device connecting pad by a bonding wire that passes through the through-hole; wherein
the bonding area and the imaging device are bonded with a bonding material.

10. The imaging apparatus according to claim 7, wherein the bonding wire is covered with a first insulting member.

11. The imaging apparatus according to claim 7, further comprising a light transmitting plate on an upper surface side of the insulating base body at a distance from the upper surface of the insulating base body, the light transmitting plate abutting the first insulting member.

12. The imaging apparatus according to claim 7,
wherein:
the bonding area and the imaging device are bonded with a bonding material; and
the first insulating member and the bonding material are made of the same material.

13. The imaging apparatus according to claim 7, further comprising an electronic part or a wiring board provided on the upper surface of the insulating base body; wherein
the electronic part or the wiring board is covered with a second insulating member attached to the insulating base body.

14. The imaging apparatus according to claim 7,
wherein:
the through-hole comprises a rectangular shape in a perspective plan view;
imaging device connecting pads are disposed in correspondence to a pair of sides of the through-hole in the rectangular shape; and
the imaging device is electrically connected to the imaging device connecting pads at portions corresponding to the pair of sides of the through-hole and is bonded to an area that corresponds to another pair of sides of the through-hole, the area being on the insulating base body.

15. The imaging apparatus according to claim 7, wherein the imaging device comprises a signal processing unit overlapping with the bonding area in a perspective plan view.

16. The imaging apparatus according to claim 7, further comprising a reinforcing layer provided in the insulating base body, the reinforcing layer overlapping with the imaging device connecting pad in a perspective plan view.

17. The imaging device accommodating package according to claim 7, wherein a width of an opening of the through-hole on a lower surface side of the insulating base body is larger than a width of an opening of the through-hole on an upper surface side of the insulating base body.

18. The imaging device accommodating package according to claim 7, wherein the inner surface comprises an inclined surface, a curved surface, or a step.

* * * * *